(12) United States Patent
Park et al.

(10) Patent No.: US 8,144,481 B2
(45) Date of Patent: Mar. 27, 2012

(54) MEMORY BOARD STRUCTURE HAVING STUB RESISTOR ON MAIN BOARD

(75) Inventors: Sung-Joo Park, Anywang-si (KR); Ki-Hyun Ko, Yongin-si (KR); Myung-Hee Sung, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 82 days.

(21) Appl. No.: 12/632,853

(22) Filed: Dec. 8, 2009

(65) Prior Publication Data

US 2010/0177492 A1  Jul. 15, 2010

(30) Foreign Application Priority Data

Jan. 9, 2009 (KR) .................. 10-2009-0002035

(51) Int. Cl.
*H01R 9/00* (2006.01)
(52) U.S. Cl. .................. 361/775; 361/728; 361/782
(58) Field of Classification Search .................. 361/775, 361/728, 782
See application file for complete search history.

(56) References Cited

U.S. PATENT DOCUMENTS 6,392,897 B1 * 5/2002 Nakase et al. ................ 361/785
7,411,806 B2 * 8/2008 Funaba et al. ................ 365/63

FOREIGN PATENT DOCUMENTS

| JP | 06283303 | 10/1994 |
| JP | 08124707 | 5/1996 |
| JP | 11283802 | 10/1999 |

* cited by examiner

*Primary Examiner* — Yuriy Semenenko
*Assistant Examiner* — Andargie M Aychillhum
(74) *Attorney, Agent, or Firm* — Volentine & Whitt, PLLC

(57) ABSTRACT

A memory system includes; a main board having memory bus with a wiring line communicating a signal from a memory controller mounted on the main board, first and second module sockets mounted on the main board and connecting the wiring line to first and second memory modules respectively inserted into the first and second module sockets, where the first memory module includes a first electrode connected to the wiring line and the second memory module includes a second electrode connected to the wiring line, and first and second stub resistors disposed on the main board and arranged as primary dual-branching stub resistors forming a T-branch connection structure between the first and second electrodes and a branching node connected to the wiring line.

4 Claims, 12 Drawing Sheets

MEMORY BOARD STRUCTURE HAVING STUB RESISTOR ON MAIN BOARD

PRIORITY STATEMENT

This application claims priority under 35 U.S.C. §119 to Korean Patent Application No. 10-2009-0002035 filed on Jan. 9, 2009, the subject matter of which is hereby incorporated by reference.

BACKGROUND

The inventive concept relates to memory modules within data processing apparatuses. More particularly, the inventive concept relates to a memory board structure in which a plurality of memory modules is connected to module sockets on a main board.

Various integrated circuit devices, (e.g., memory devices, control devices and related logic devices) are operationally and functionally grouped to implement various data processing apparatuses, such as personal computers, portable computers, PDAs, servers, workstations, etc.

The principle data storage unit (or "main memory") within many data processing apparatuses is implemented with dynamic random access memories (DRAMs). The DRAM is a type of volatile memory wherein a transistor is used in each memory cell to access data in the form of electrical charge placed on a corresponding storage capacitor.

As typically implemented to form a main memory, a collection of DRAMs is operationally and functionally grouped on a memory module. The term "memory module" is well understood in the art and generally refers to a plurality of individual memory devices (i.e., separate integrated circuits) grouped to operate in response to various functional commands. In one common configuration, a memory module assembles a plurality of integrated circuit devices, principally including memory devices, on a printed circuit board (PCB). Each integrated circuit device on the memory module is electrically connected to circuitry on a corresponding main PCB (or "main board", sometimes referred to as the motherboard) via a plurality of connection pins (or "taps").

Conventional examples of memory modules including a plurality of memory devices mounted on a PCB include the single in-line memory module (SIMM) and the dual in-line memory module (DIMM). The SIMM mounts memory devices on only one principal surface (or "one side") of a PCB. The DIMM mounts memory devices on both sides of a PCB. In recent years, the DIMM has been more generally used as the memory module.

As operatively assembled, the DIMM is inserted into a connector (or module socket) secured to the main board. In certain data processing apparatuses, a plurality of memory modules may be commonly connected to a memory controller and/or central processing unit (CPU) via one or more buses. This configuration allows a great number of DRAMs to be functionally assembled into a large main memory.

Conventional DIMMs include the fully buffered dual in-line memory module (FBDIMM) and the registered dual in-line memory module (RDIMM). Certain data processing apparatuses, such as servers, process very large quantities of data. Accordingly, RDIMMs are widely used as constituent memory modules within servers. The FBDIMM is generally used where a relatively high-speed data packet is provided in a data processing apparatus (e.g., from a microprocessor) to a constituent memory system. The data packet must be converted into a compatible memory command and properly synchronized before data can be accessed.

There are many data processing apparatuses that use this type of approach. Consider for example, the conventionally understood stub series terminated transceiver logic (SSTL) which is used as a small-amplitude interface within certain memory systems. (See, e.g., Konishi et al., "Interface Technologies for Memories and ASICs-Review and Future Direction", Vol. E82-C, No. 3.) In general, a memory system including the SSTL includes a memory controller, a signal line, a connector, and a memory module—all collectively mounted on a main board.

Within this type of memory system, the memory module includes "M" memory devices (M being a natural number equal to or greater than 2) mounted on both surfaces of the module substrate. Data terminals for the M memory devices are connected to each module data terminal. An access control data terminal, (e.g., an address terminal) for each memory device is connected to a corresponding module access control terminal. The signal line connects at one end a signal terminal of the memory controller and at the other end a terminal having a predetermined voltage. A plurality of memory modules is connected in parallel to the signal line via connectors.

In a case where the number of data terminals in a memory device is "N" (N being a natural number equal to or greater than 2) and the number of memory devices mounted on one side of each memory module is M, the memory system will have (M×N) data signal lines. During each data access operation (e.g., a read or write operation) M memory devices mounted on a plurality of memory modules may be selected using a device selection signal generated by the memory controller. In this configuration, one end of each signal line may be connected to a termination voltage through a termination resistor.

Various "module lines" (e.g., command, address, and/or data signal lines) that connect to the module terminal of the memory module and the terminals of the memory devices may include wiring lines branched from signal line(s) on the main board through corresponding connectors. These module lines may further have stub resistors provided therein. The stub resistors serve as matching loads that reduce signal reflections on the module lines.

Characteristic impedance mismatching generally occurs at a branch point of a module line. Therefore, the stub resistor is needed to reduce the characteristic impedance mismatching. However, as the resistance value of the stub resistor increases, a corresponding voltage drop increases. As a result, the attenuation of signal voltages (e.g., address and data signals) can occur and errors may arise during data access operations.

On the other hand, when the resistance value of the stub resistor is reduced in order to avoid signal voltage attenuation, signal reflections may occur and signal voltage waveforms may become distorted, and such distortions may also result in errors. And as the data access speed of contemporary memory systems increases, the frequency of signal waveforms also increases and the risk of significant distortion rises. Further, as the length of module lines increases the risk of signal waveform distortion also rises. In memory systems using SSTL, module lines traversing the memory module and the memory system generally include signal line branching. Such branching, as noted above, also increases the risk of errors occurring during data access operations due to signal reflections (really, just another form of signal line noise or interference). Thus, module line branching has been one factor limiting further increases in the operating speed of memory systems.

The conventional synchronous dynamic random access memory (SDRAM) synchronously provides in simultaneous sequence (1) input of a column address, (2) reading of data, and (3) output of data (i.e., the SDRAM provides a three-stage data pipe line). In contrast, the DRAM processes data only during a period between receipt of a column address and data output. Since the SDRAM synchronously operates through a three-stage data pipe line at least three (3) clocks are required to initially output data, but a single clock is required after the start-up period. Hence, it is possible to access data from a SRAM at relatively high speed.

In this context, the double data rate (DDR) registered DIMM processes data synchronously with both the rising and falling edges of a clock signal, unlike the SDRAM that processes data in synchronization with the rising edge of the clock signal.

In a general DIMM, stub resistors are provided on the substrate (or "board") of the memory module. Daisy chain or T-branch connection may also be used for module lines traversing the memory module board. However, it is preferable to use the T-branch structure in order to increase a memory access operation speed.

In order to reduce manufacturing cost and overall size of memory modules, it is necessary to address the problems associated with stub resistors provided on memory module boards. In addition, it is necessary to provide a memory module capable of operating at high-speed within various data processing apparatuses.

SUMMARY

Embodiments of the inventive concept provide a memory module board capable of removing stub resistors from the memory module to a corresponding main board to thereby reduce manufacturing cost and enable higher operating speed.

In one embodiment, there is provided a memory system comprising; a main board comprising memory bus having a wiring line communicating a signal from a memory controller mounted on the main board, first and second module sockets mounted on the main board and configured to connect the wiring line to first and second memory modules respectively inserted into the first and second module sockets, wherein the first memory module comprises a first electrode connected to the wiring line and the second memory module comprises a second electrode connected to the wiring line, and first and second stub resistors disposed on the main board and arranged as primary dual-branching stub resistors forming a T-branch connection structure between the first and second electrodes and a branching node connected to the wiring line.

In a related aspect, the memory system may further comprise a secondary stub resistor connected to the wiring line behind the branching node.

In another embodiment, there is provided a memory system comprising; a main board comprising memory bus having a plurality of wiring lines communicating signals from a memory controller mounted on the main board, first and second module sockets mounted on the main board and configured to connect the wiring line to first and second memory modules respectively inserted into the first and second module sockets, wherein the first memory module comprises a plurality of odd electrodes and the second memory module comprises a plurality of even electrodes opposing the plurality of odd electrodes, and an array of first and second stub resistors disposed on the main board and respectively arranged as dual-branching stub resistors, each forming a T-branch connection structure between respective ones of the odd and even electrodes and a branching node connecting one of the plurality of wiring lines.

In a related aspect the memory system may further comprises a secondary stub resistor associated with each dual-branching stub resistors and connected to the one of the plurality of wiring lines behind the corresponding branching node.

In another related aspect, the array of first and second stub resistors may be arranged in a multi-port array structure disposed on the main board between the first and second module sockets.

In another related aspect, the plurality of odd electrodes and the plurality of even electrodes may be arranged such that each odd electrode is opposed one-for-one by an even electrode across the multi-port array structure and each opposing pair of odd and even electrodes is separated by respective dual-branching stub resistors.

In another related aspect, the array of first and second stub resistors and associated secondary resistors may be arranged in a multi-port array structure disposed on the main board between the first and second module sockets.

In another related aspect, the plurality of odd electrodes and the plurality of even electrodes may be arranged such that each odd electrode is opposed one-for-one by an even electrode across the multi-port array structure and every other opposing pair of odd and even electrodes is separated by respective dual-branching stub resistors, and a secondary resistor associated with dual-branching stub resistors connecting one of the every other opposing pair of odd and even electrodes is connected to either an odd or an even electrode of a pair of odd and even electrodes adjacent to the every other opposing pair of odd and even electrodes.

BRIEF DESCRIPTION OF THE DRAWINGS

Example embodiments will be more clearly understood from the following brief description taken in conjunction with the accompanying drawings.

FIG. 1 is a diagram illustrating conventional memory modules connected in a daisy chain;

FIG. 2 is a diagram illustrating conventional memory modules connected in a T-branch shape;

FIG. 3 is a diagram illustrating a stub resistor provided on the conventional memory modules of FIGS. 1 and 2;

FIG. 4 is a diagram illustrating memory modules connected according to an embodiment of the inventive concept;

FIG. 5 is a diagram illustrating memory modules connected according to another embodiment of the inventive concept;

FIG. 6 is a diagram illustrating an example of a stub resistor array unit provided between the module sockets of FIG. 4;

FIG. 7 is a diagram illustrating the structure of a general multi-port array resistor;

FIG. 8 is a diagram illustrating another example of the stub resistor array unit provided between the module sockets of FIG. 4;

FIG. 9 is a diagram illustrating an example of a stub resistor array unit provided between the module sockets of FIG. 5;

FIG. 10 is a diagram illustrating an example of the connection pattern structure for the stub resistor array unit of FIGS. 8 and 9;

FIG. 11 is a diagram illustrating an example of the structure of a memory system including the memory board shown in FIGS. 4 and FIG. 5; and FIG. 12 is a simulation waveform diagram illustrating improvement in operating speed provided by an embodiment of the inventive concept.

DETAILED DESCRIPTION OF EXAMPLE EMBODIMENTS

Figure 1:
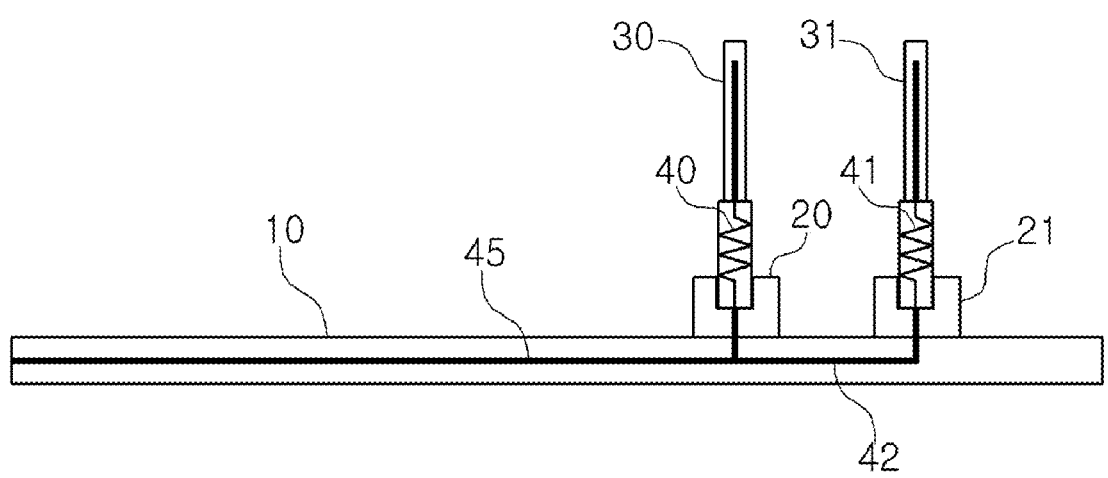
FIGS. 1 to 12 represent non-limiting, example embodiments as described herein.

Hereinafter, a memory module board structure comprising stub resistors formed on a corresponding main board according to embodiments of the inventive concept will be described with reference to the accompanying drawings. However, embodiments of the inventive concept may be variously embodied and should not be construed as being limited to only the illustrated embodiments. Rather, these embodiments are provided so that this disclosure will be thorough and complete, and will fully convey the concept of example embodiments to those of ordinary skill in the art.

In the drawings, the relative thickness of boards, layers and regions, as well as the relative size of constituent components may be exaggerated for clarity. Throughout the drawings and written description, like reference numbers and labels are used to denote like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper", "vertical", "horizontal", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Certain conventional examples will now be described as a predicate to explanations of example embodiments of the inventive concept.

Figure 2:
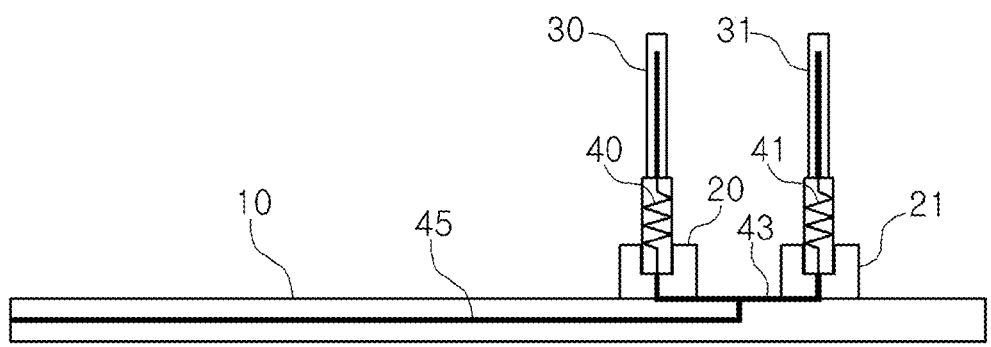

FIG. 1 is a diagram illustrating conventional memory modules connected in a daisy chain. FIG. 2 is a diagram illustrating conventional memory modules connected in a T-branch.

In FIG. 1, main board 10 serves as a motherboard for a data processing apparatus, and mounts first and second memory modules 30 and 31. The memory modules may be referred to as "memory module boards" in order to distinguish such from the main board 10. Stub resistors 40 and 41 are incorporated at the edge of the conventional memory module boards 30 and 31, respectively, and the memory modules 30 and 31 are mechanically assembled and electrically connected to the main board 10 by inserting same into corresponding module sockets 20 and 21.

As shown in FIG. 1, a wiring line including segments 45 and 42 are provided on the main board 10 and are connected to the corresponding stub resistors 40 and 41 through the module sockets 20 and 21 in a daisy chain pattern. In contrast, the wiring line including segments 45 and 43 forms a T-branch connection pattern.

Figure 3:
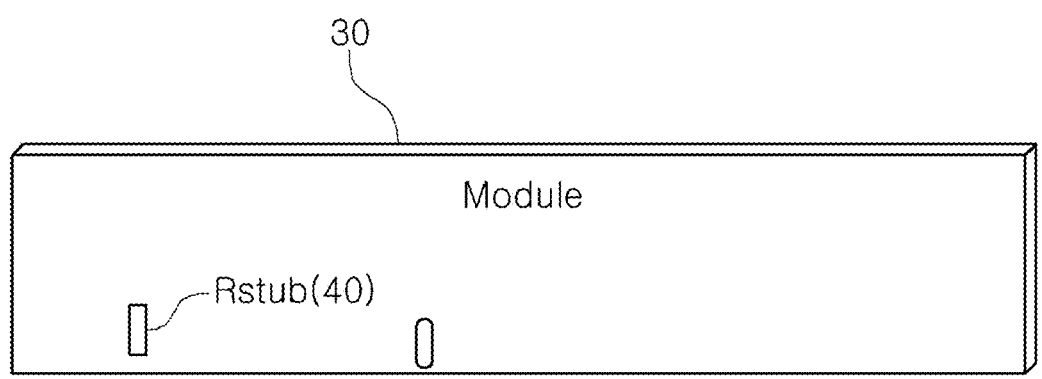

FIG. 3 is a diagram illustrating the location of a stub resistor provided on the conventional memory modules of FIGS. 1 and 2. As shown in FIG. 1, the stub resistor 40 of the memory module 30 is physically disposed on the board towards one outer (or lower) edge. Unfortunately, as will be better appreciated hereafter, this disposition of stub resistors on memory module boards drives up manufacturing cost and tends to increase the overall size of the memory module. Additionally, this conventional disposition of stub resistors on memory module boards precludes further improvement in the speed of access operations to the memory device provided on memory module. For example, the conventional memory module design is largely incapable of providing data access operations at speeds of 2 Gbps (i.e., exceeding 1.8 Gbps) as mandated by the conventionally understood DDR3 and/or DDR4 standards.

Embodiments of the inventive concept are not limited in this manner and are capable of providing smaller, faster operating and more cheaply manufactured memory modules. Example embodiments of the inventive concept will now be described with reference to FIGS. 4 and 5.

Figure 4:
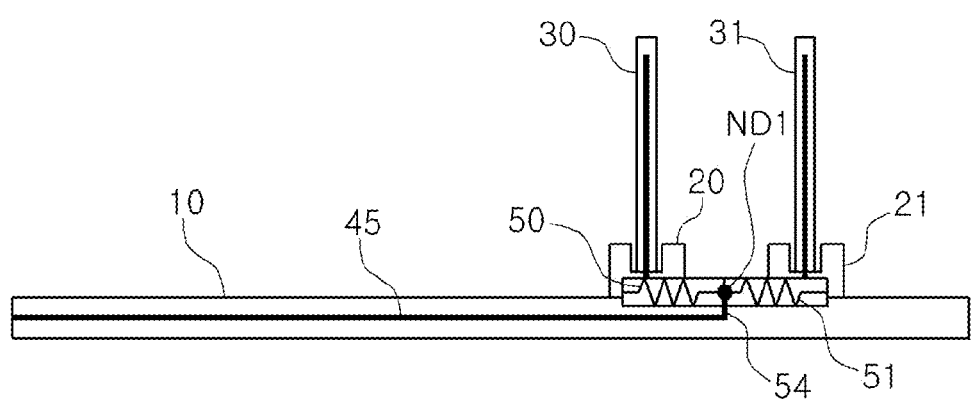

Referring to FIG. 4, module sockets 20 and 21 are mounted on the main board 10 to provide electrical connection of the memory modules 30 and 31 to a memory controller 100 via (e.g.,) a memory bus L1. (See also, FIG. 11). A plurality of memory devices is mounted on the memory module boards 30 and 31 that are respectively connected to the module sockets 20 and 21 and are controlled by the memory controller 100. In addition, an electrical connection structure between the memory module boards 30 and 31 and the main board 10 is assumed to be T-branch structure, and stub resistor array units 50 and 51 are arranged on the main board so as to be branched between the module sockets 20 and 21 in order to function as stub resistors with respect to the memory module boards 30 and 31. Each of the plurality of memory devices may be DDR4 DRAMs, for example.

As can be seen from FIG. 4, unlike the conventional memory module board structures shown in FIGS. 1 and 2, the stub resistors 50 and 51 are disposed and arranged on the main board 10 in a pattern that branches between adjacent module sockets 20 and 21. As can be seen from FIG. 4, since a wiring line 54 connected to a branching node ND1 between the first stub resistor 50 associated with the first memory module 30 and the second stub resistor 51 associated with the second memory module 31 is connected to the wiring line 45, electrical connection is faithfully provided between the memory module boards 30 and 31 and the main board 10 using the T-branch structure.

Figure 5:
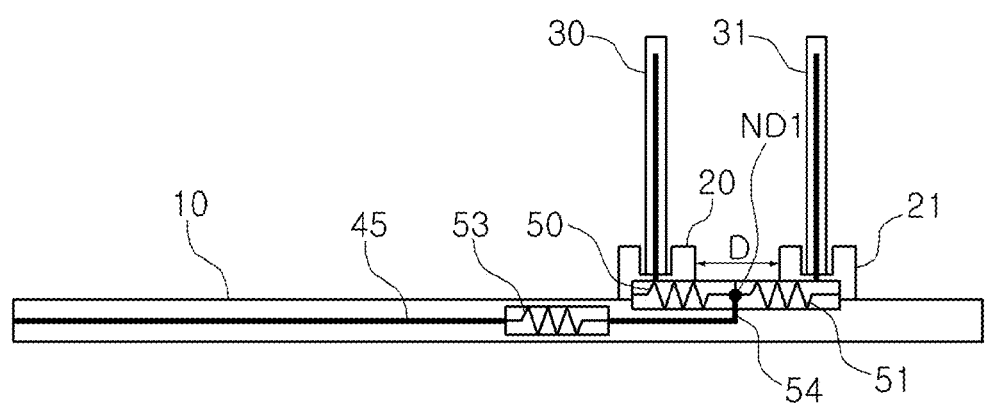

FIG. 5 shows the structure of a memory module board according to another embodiment of the inventive concept. As can be seen from FIG. 5, a "secondary stub resistor" 53 is additionally provided along the length of the wiring line 54 and disposed "behind" the branching node ND1 (i.e., connected on the opposite side of the branching node away from the primary stub resistors arranged between adjacent memory module electrodes). Thus, the first stub resistor 50 associated with the first memory module 30 and the second stub resistor 51 associated with the second memory module 31 may be referred to as "primary" stub resistors series connected between edge-located electrodes for each one of the respective memory modules.

Yet, as can be seen from FIG. 5, the primary and secondary stub resistors 50, 51, and 53 are disposed and arranged on the main board 10 to provide an electrical connection between the memory module boards 30 and 31 and the main board 10 using a T-branch connection structure similar to the embodiment of FIG. 4.

Figure 6:
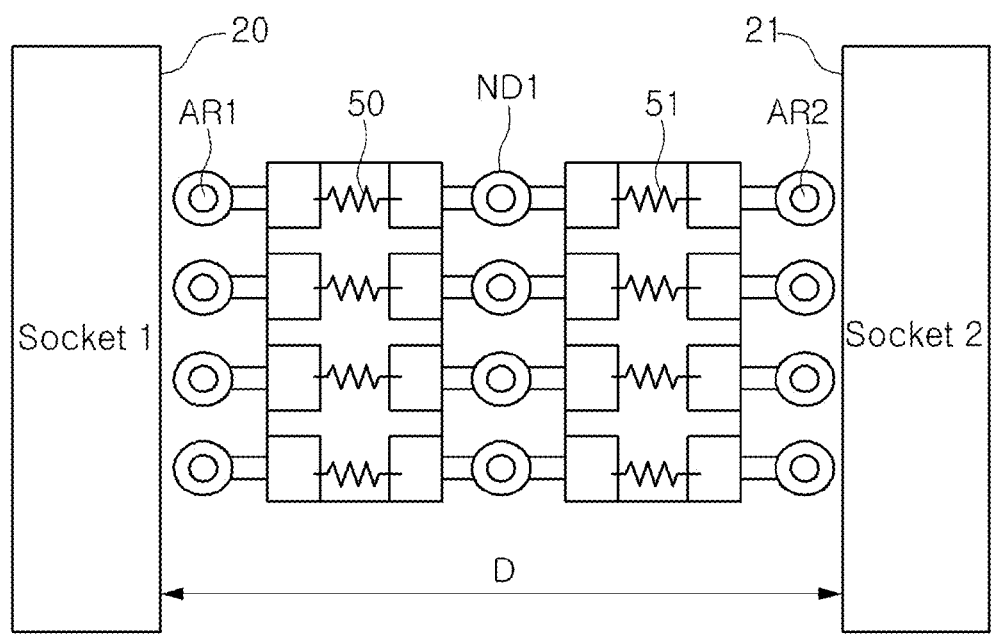

An array of primary stub resistors 50 and 51 associated with the first and second module sockets 20 and 21 of FIG. 4 are further illustrated in FIG. 6. That is, the array of "primary dual-branching stub resistors" 50 and 51 are respectively connected in series between opposing first and second electrode terminals AR1 and AR2. In this context, one pair of primary dual-branching stub resistors 50 and 51 is arranged in a branching structure from a respective branching node ND1 between adjacent memory modules, where each one of the adjacent first and second memory modules is electrically connected at a corresponding first and second electrode terminal AR1 and AR2. While the connection structure of FIG. 6 functions well, it is difficult to reduce the adjacent module separation distance "D".

Figure 7:
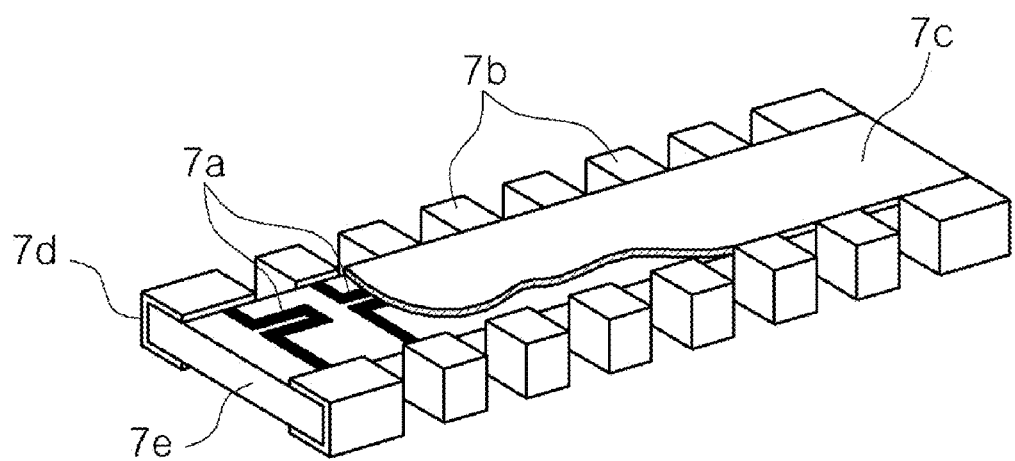
Figure 8:
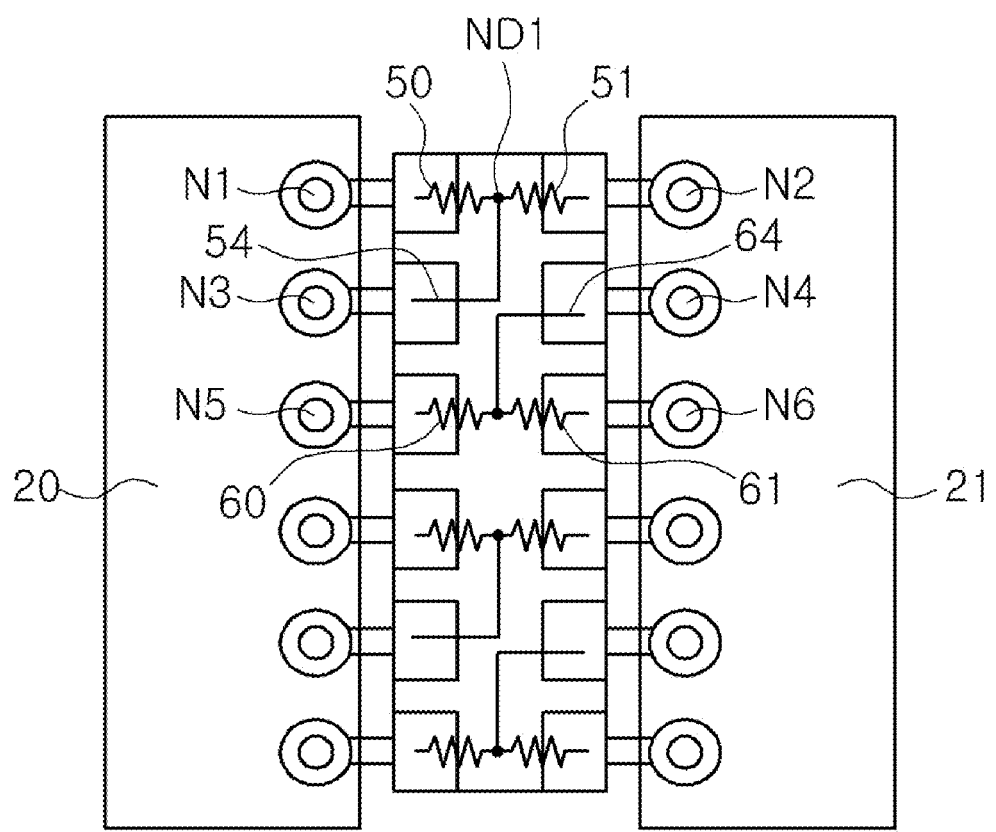

Therefore, in order to reduce the adjacent module separation distance D, a stub resistor array unit may be formed according to the embodiment of the inventive concept shown in FIG. 8. This multi-port array structure, as shown in FIG. 8, may be formed by modifying the more general array structure of FIG. 7.

The multi-port array resistor shown in FIG. 7 comprises individual resistors 7a, individual electrodes 7b, a protective film 7C, an alumina substrate 7e, and a wrap around electrode 7d. In contrast, the embodiment of the inventive concept illustrated in FIG. 8 comprises primary dual-branching stub resistors 50 and 51 connected in a branching pattern from the branching node ND1 and between first and second electrodes N1 and N2, wherein the branching node ND1 is connected to a third electrode N3 via the wiring line 54, as shown in FIG. 4.

Stated in other terms, the adjacent memory module sockets 20 and 21 provide dual opposing odd and even electrodes (i.e., N1, N3, N5 . . . opposing N2, N4, N6 . . . ). A first pair of primary dual-branching stub resistors 50/51 are connected between the first pair of opposing odd/even electrodes N1/N2. The first branching node ND1 corresponding to the first pair of primary dual-branching stub resistors 50/51 is connected to one of the second pair of opposing odd/even electrodes N3/N4 (or one of an adjacent pair of opposing odd/even electrodes).

With this configuration, the resulting "off-set T-branch structure" reduces the adjacent memory module separating distance D between the first and second module sockets 20 and 21, as compared to the resistor array shown in FIG. 6. A second pair of primary dual-branching stub resistors 60/61 are connected between a third pair of opposing odd/even electrodes N5/N6, and the corresponding second branching node is connected to a second wiring line 64 (not shown, but hidden in FIGS. 4 and 5 behind first wiring lines 54). Thus, a stub resistor array unit may include a plurality of two-branch resistor units in a multi-port array resistor package. In the illustrated example, three (3) electrode terminals N1, N2, and N3 may be formed for each pair of primary dual-branching stub resistors outside the multi-port array resistor package.

Figure 9:
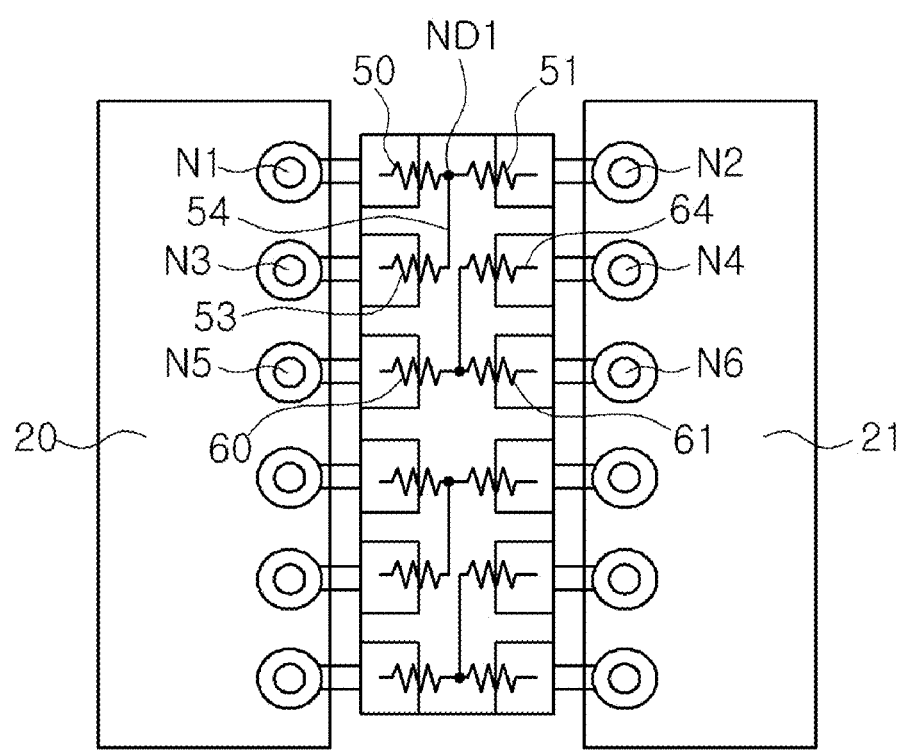

FIG. 9 is a diagram further illustrating an example of a stub resistor array unit provided between the adjacent module sockets of FIG. 5 and including the secondary stub resistor 53. Here again, the structure of the embodiment shown in FIG. 8 allows the adjacent memory module separation distance D to be reduced, as compared to the array shown in FIG. 6. The provision of the secondary stub resistor 53 within the structure described above with respect to FIG. 8 is straightforward. The stub resistor array unit shown in FIG. 9 may include a plurality of three-branch resistor units in a multi-port array resistor package.

Figure 10:
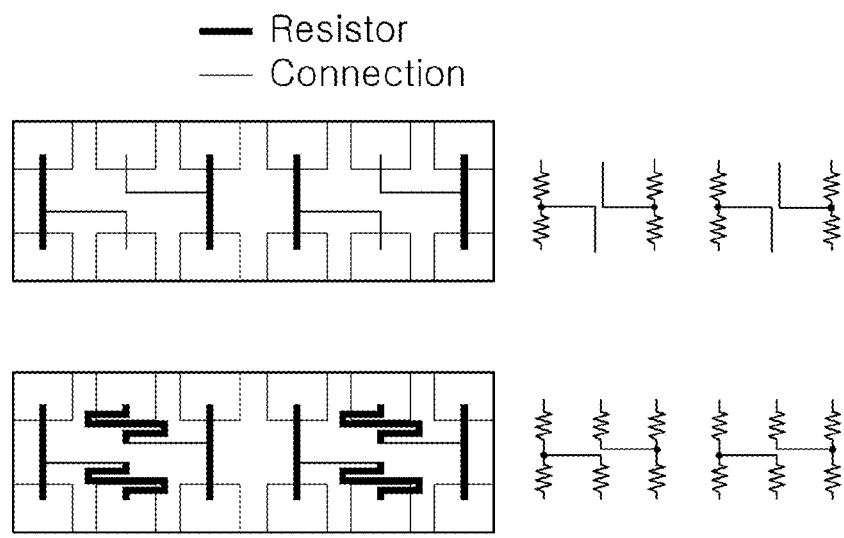

FIG. 10 is a diagram illustrating an example of the connection pattern structure of the stub resistor array unit shown in FIGS. 8 and 9, in which a bold solid line indicates a stub resistor and a thin solid line indicates a connection line.

Figure 11:
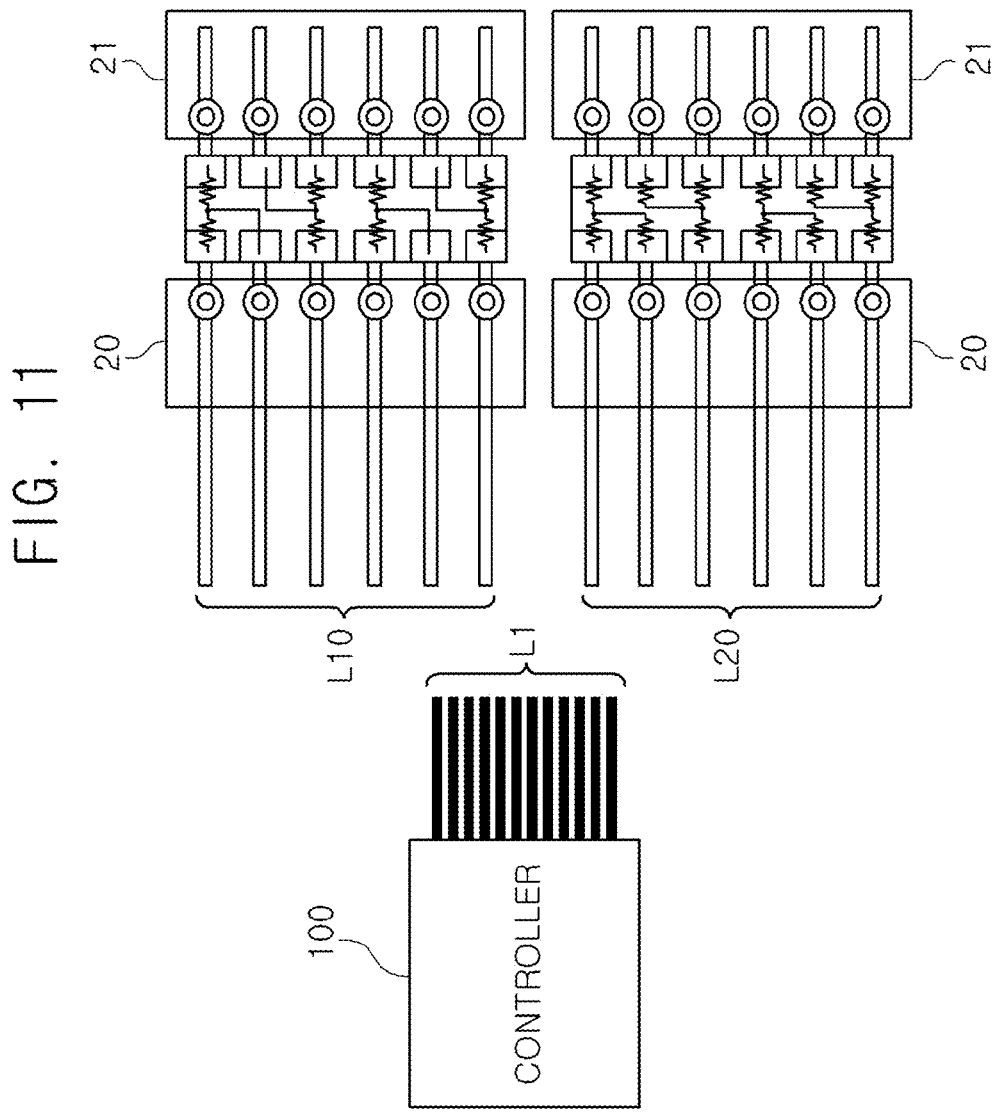

FIG. 11 is a diagram illustrating an example of the structure of a memory system including the memory board shown in FIG. 4 or FIG. 5, and shows the selective connection of a memory bus L1 of the memory controller 100 to one of the buses L10 and L20 on the main board. In FIG. 11, reference numerals 20 and 21 denote module sockets.

Figure 12:
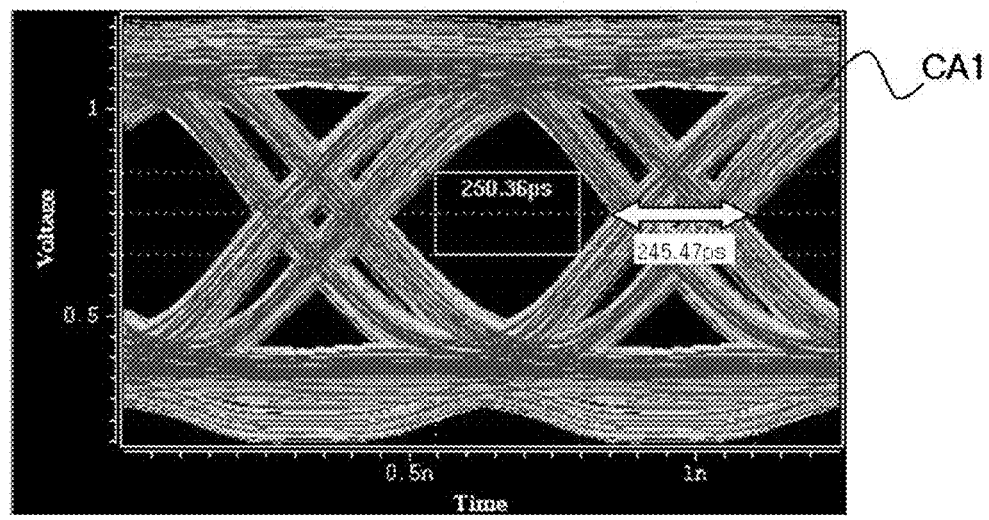
Figure 12:
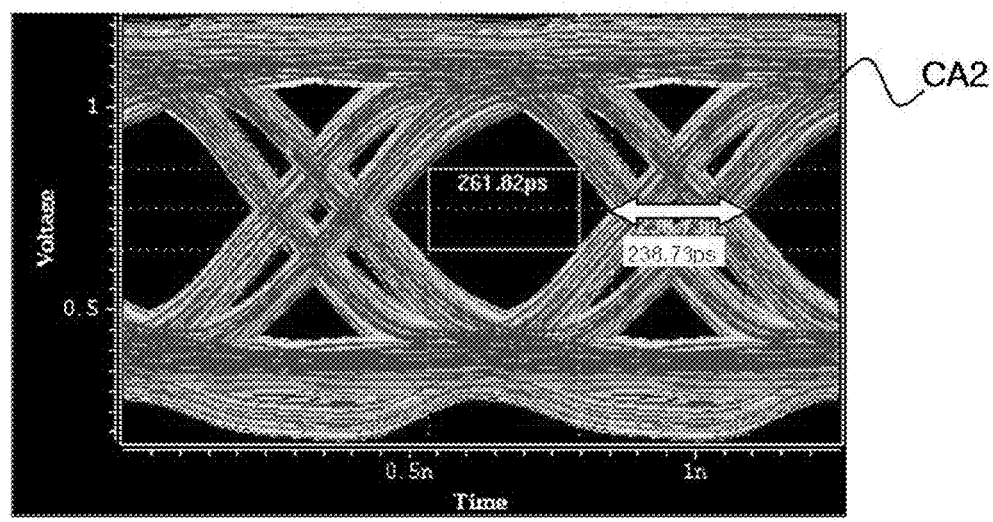

FIG. 12 is a simulation waveform diagram illustrating the improvement of an operation speed in the example embodiment of the inventive concept. In FIG. 12, CA1 indicates the related art using the daisy chain, and CA2 indicates the simulation results obtained by the structure shown in FIG. 4.

In FIG. 12, the horizontal axis indicates time (nanosecond), and the vertical axis indicates a voltage. In the example embodiment of the inventive concept, a margin signal period capable of preparing for read/write access speeds in the T-branch structure is 261.82 ps. However, in the case of CA1, the margin signal period is 250.36 ps. That is, the margin signal period (238.73 ps) in CA2 is significantly shorter than that (245.47 ps) in CA1. Therefore, the memory access operation can be performed at a high speed.

As described above, since the stub resistor may be removed from the memory module, module manufacturing cost may be reduced, and a board space for mounting devices is increased. In addition, the T-branch structure formed on the main board makes it possible to improve a memory access operation speed.

While example embodiments have been particularly shown and described, it will be understood by one of ordinary skill in the art that variations in form and detail may be made therein without departing from the scope of the claims. For example, the detailed structure of the memory board or the arrangement or connection structure of the stub resistors may be changed without departing from the spirit and scope of the inventive concept.

In the above-mentioned example embodiment, the DRAM module has been described as an example. However, the technical spirit of the inventive concept can be applied to other volatile memories, such as a pseudo SRAM, or non-volatile memories.

What is claimed is:

1. A memory system comprising:
a main board comprising memory bus having a plurality of wiring lines communicating signals from a memory controller mounted on the main board;
first and second module sockets mounted on the main board and configured to connect the wiring line to first and second memory modules respectively inserted into the first and second module sockets, wherein the first module socket comprises a first plurality of electrodes and the second module socket comprises a second plurality of electrodes opposing the first plurality of electrodes;
first and second stub resistors disposed on the main board and respectively arranged as dual-branching stub resistors, each forming a T-branch connection structure between one of the first electrodes and one of the second electrodes and a branching node connecting one of the plurality of wiring lines; and
a third stub resistor disposed between the branching node and either one of the first and second electrodes.

2. The memory system of claim 1, wherein the array of first and second stub resistors are arranged in a multi-port array structure disposed on the main board between the first and second module sockets.

3. The memory system of claim 2, wherein the first plurality of electrodes and the second plurality of electrodes are arranged such that each first electrode is opposed one-for-one by the second electrode across the multi-port array structure and each opposing pair of first and second electrodes is separated by respective dual-branching stub resistors.

4. The memory system of claim 1, wherein the array of first and second stub resistors and associated secondary resistors are arranged in a multi-port array structure disposed on the main board between the first and second module sockets.

* * * * *